United States Patent
Feng et al.

(10) Patent No.: US 11,069,689 B2
(45) Date of Patent: Jul. 20, 2021

(54) MANUFACTURING METHOD OF SEMICONDUCTOR MEMORY DEVICE

(71) Applicants: UNITED MICROELECTRONICS CORP., Hsin-Chu (TW); Fujian Jinhua Integrated Circuit Co., Ltd., Quanzhou (CN)

(72) Inventors: Li-Wei Feng, Kaohsiung (TW); Yu-Cheng Tung, Kaohsiung (TW)

(73) Assignees: UNITED MICROELECTRONICS CORP., Hsin-Chu (TW); Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 16/789,435

(22) Filed: Feb. 13, 2020

(65) Prior Publication Data
US 2020/0185391 A1 Jun. 11, 2020

Related U.S. Application Data

(63) Continuation of application No. 15/987,919, filed on May 24, 2018, now Pat. No. 10,600,790.

(30) Foreign Application Priority Data

Jul. 11, 2017 (CN) .......................... 201710560153.5

(51) Int. Cl.
*H01L 27/108* (2006.01)
*H01L 27/105* (2006.01)
(Continued)

(52) U.S. Cl.
CPC .... *H01L 27/10894* (2013.01); *H01L 27/1052* (2013.01); *H01L 27/10873* (2013.01);
(Continued)

(58) Field of Classification Search
CPC ......... H01L 27/10894; H01L 27/10885; H01L 27/10873; H01L 27/10888; H01L 29/78
See application file for complete search history.

(56) References Cited

U.S. PATENT DOCUMENTS 9,082,837 B2 7/2015 Perera
2012/0228678 A1 9/2012 Han
(Continued)

FOREIGN PATENT DOCUMENTS

CN 101872745 A 10/2010
CN 102339829 A 2/2012
(Continued)

*Primary Examiner* — Joseph C. Nicely
(74) *Attorney, Agent, or Firm* — Winston Hsu

(57) ABSTRACT

A manufacturing method of a semiconductor memory device includes the following steps. A contact hole is formed on a memory cell region of a semiconductor substrate and exposes a part of the semiconductor substrate. A dielectric layer is formed on the semiconductor substrate. A first trench penetrating the dielectric layer is formed on a memory cell region of the semiconductor substrate. A second trench penetrating the dielectric layer is formed on the peripheral region. A metal conductive layer is formed. The first trench and the second trench are filled with the metal conductive layer for forming a bit line metal structure in the first trench and a first metal gate structure in the second trench. A contact structure is formed in the contact hole, and the contact structure is located between the bit line metal structure and the semiconductor substrate.

19 Claims, 13 Drawing Sheets

(51) Int. Cl.
*H01L 27/11573* (2017.01)
*H01L 29/66* (2006.01)
*H01L 29/51* (2006.01)
*H01L 29/78* (2006.01)

(52) U.S. Cl.
CPC .. *H01L 27/10885* (2013.01); *H01L 27/10888* (2013.01); *H01L 27/11573* (2013.01); *H01L 29/517* (2013.01); *H01L 29/66545* (2013.01); *H01L 29/66553* (2013.01); *H01L 29/78* (2013.01); *H01L 27/10823* (2013.01)

(56) References Cited

U.S. PATENT DOCUMENTS

| | | |
|---|---|---|
| 2012/0280296 A1 | 11/2012 | Baars |
| 2013/0256904 A1* | 10/2013 | Im ............... H01L 23/53271 257/774 |
| 2015/0123238 A1* | 5/2015 | Jang ............... H01L 27/10823 257/503 |
| 2016/0087072 A1* | 3/2016 | Lim ............... H01L 27/10873 438/253 |
| 2016/0111326 A1 | 4/2016 | Ohori |
| 2017/0062437 A1 | 3/2017 | Lee |
| 2018/0033637 A1 | 2/2018 | Kim |
| 2018/0122809 A1* | 5/2018 | Lin ............... H01L 27/10897 |
| 2019/0035794 A1* | 1/2019 | Li ............... H01L 27/10876 |
| 2019/0081048 A1 | 3/2019 | Feng |
| 2019/0096681 A1 | 3/2019 | Wei |
| 2019/0103485 A1 | 4/2019 | Peng |

FOREIGN PATENT DOCUMENTS

| | | |
|---|---|---|
| CN | 102969347 A | 3/2013 |
| CN | 103021862 A | 4/2013 |
| CN | 103187367 A | 7/2013 |
| KR | 2001-0005296 A | 1/2001 |
| KR | 10-2012-0004241 A | 1/2012 |

* cited by examiner

MANUFACTURING METHOD OF SEMICONDUCTOR MEMORY DEVICE

CROSS REFERENCE TO RELATED APPLICATIONS

This application is a continuation of application Ser. No. 15/987,919 filed on May 24, 2018, entitled "MANUFACTURING METHOD OF SEMICONDUCTOR MEMORY DEVICE", and the entire content of which is hereby incorporated by reference.

BACKGROUND OF THE INVENTION

1. Field of the Invention

The present invention relates to a manufacturing method of a semiconductor memory device, and more particularly, to a manufacturing method of a semiconductor memory device including a bit line metal structure.

2. Description of the Prior Art

Dynamic random access memory (DRAM) is a kind of volatile storage device which is an indispensable key part of many electronic products. DRAM includes a great number of memory cells arranged for forming an array configured to store data. Each of the memory cells may be composed of a metal oxide semiconductor (MOS) transistor and a capacitor connected in series.

For product demands, the density of the memory cells in the array region has to be increased progressively, and the dimensions of the devices in the peripheral region adjacent to the array region have to be shrunken also. Accordingly, it is very important for the related field to effectively enhance the operation performance of the memory cells and the devices in the peripheral region while the dimensions of the devices are shrunken continuously.

SUMMARY OF THE INVENTION

A manufacturing method of a semiconductor memory device is provided in the present invention. A replacement metal gate process is used to form a metal gate structure in a peripheral region and a bit line metal structure in a memory cell region together for enhancing operation performance of a device in the peripheral region and reducing electrical resistance of bit lines.

According to an embodiment of the present invention, a manufacturing method of a semiconductor memory device is provided. The manufacturing method includes the following steps. A semiconductor substrate is provided. A memory cell region and a peripheral region are defined on the semiconductor substrate. A contact hole is formed on the memory cell region, and the contact hole exposes a part of the semiconductor substrate. A dielectric layer is formed on the semiconductor substrate. A first trench is formed on the memory cell region, and the first trench penetrates the dielectric layer. A second trench is formed on the peripheral region, and the second trench penetrates the dielectric layer. A metal conductive layer is formed. The first trench and the second trench are filled with the metal conductive layer for forming a bit line metal structure in the first trench and a first metal gate structure in the second trench. A contact structure is formed in the contact hole, and the contact structure is located between the bit line metal structure and the semiconductor substrate These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 are schematic drawings illustrating a manufacturing method of a semiconductor memory device according to a first embodiment of the present invention, wherein FIG. 2 is a schematic drawing in a step subsequent to FIG. 1, FIG. 3 is a schematic drawing in a step subsequent to FIG. 2, FIG. 4 is a schematic drawing in a step subsequent to FIG. 3, FIG. 5 is a schematic drawing in a step subsequent to FIG. 4, FIG. 6 is a schematic drawing in a step subsequent to FIG. 5, and FIG. 7 is a schematic drawing in a step subsequent to FIG. 6.

FIG. 8 and FIG. 9 are schematic drawings illustrating a manufacturing method of a semiconductor memory device according to a second embodiment of the present invention, wherein FIG. 9 is a schematic drawing in a step subsequent to FIG. 8.

FIGS. 10-13 are schematic drawings illustrating a manufacturing method of a semiconductor memory device according to a third embodiment of the present invention, wherein FIG. 11 is a schematic drawing in a step subsequent to FIG. 10, FIG. 12 is a schematic drawing in a step subsequent to FIG. 11, and FIG. 13 is a schematic drawing in a step subsequent to FIG. 12.

DETAILED DESCRIPTION

Figure 1:
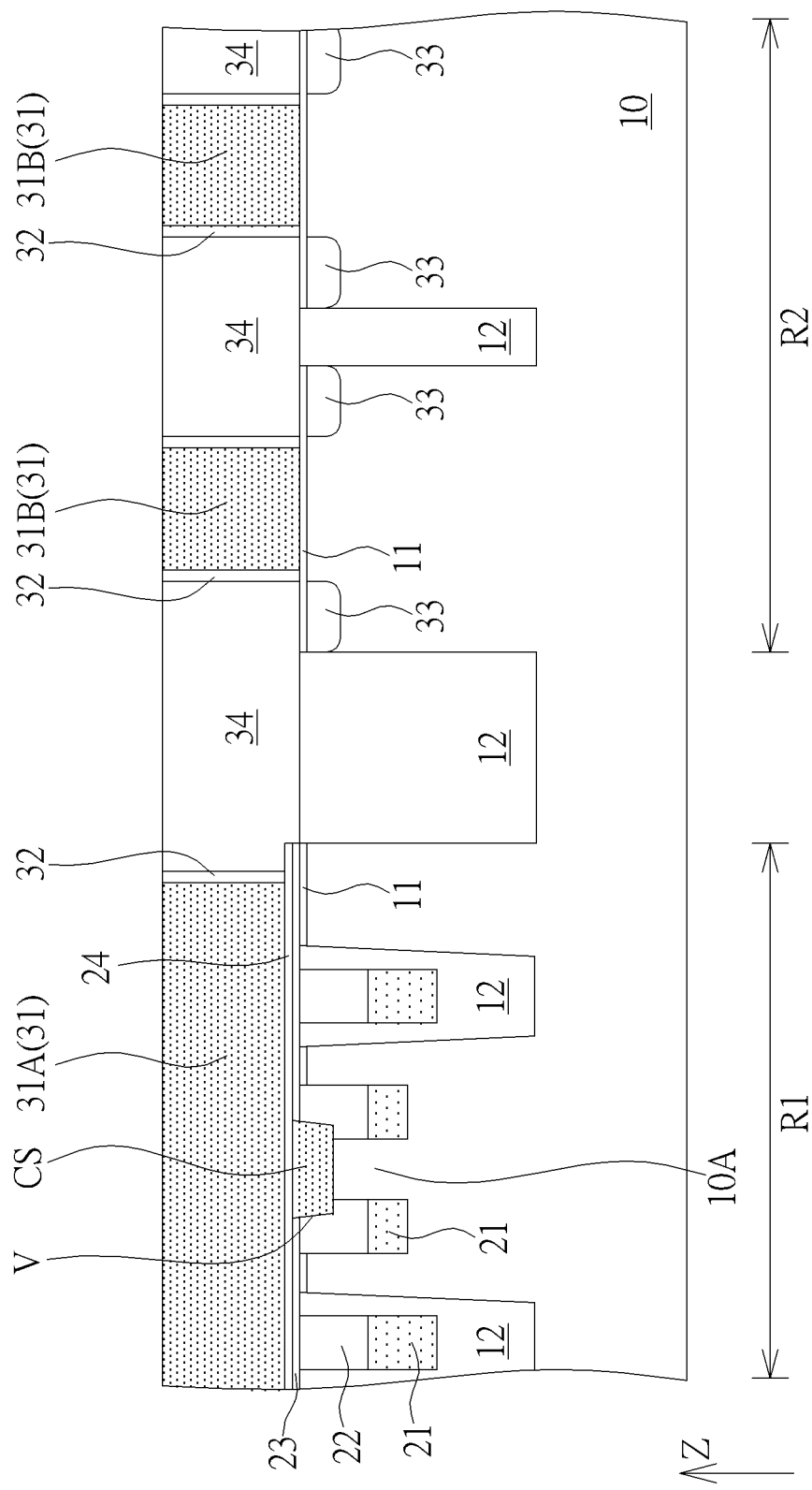
Figure 2:
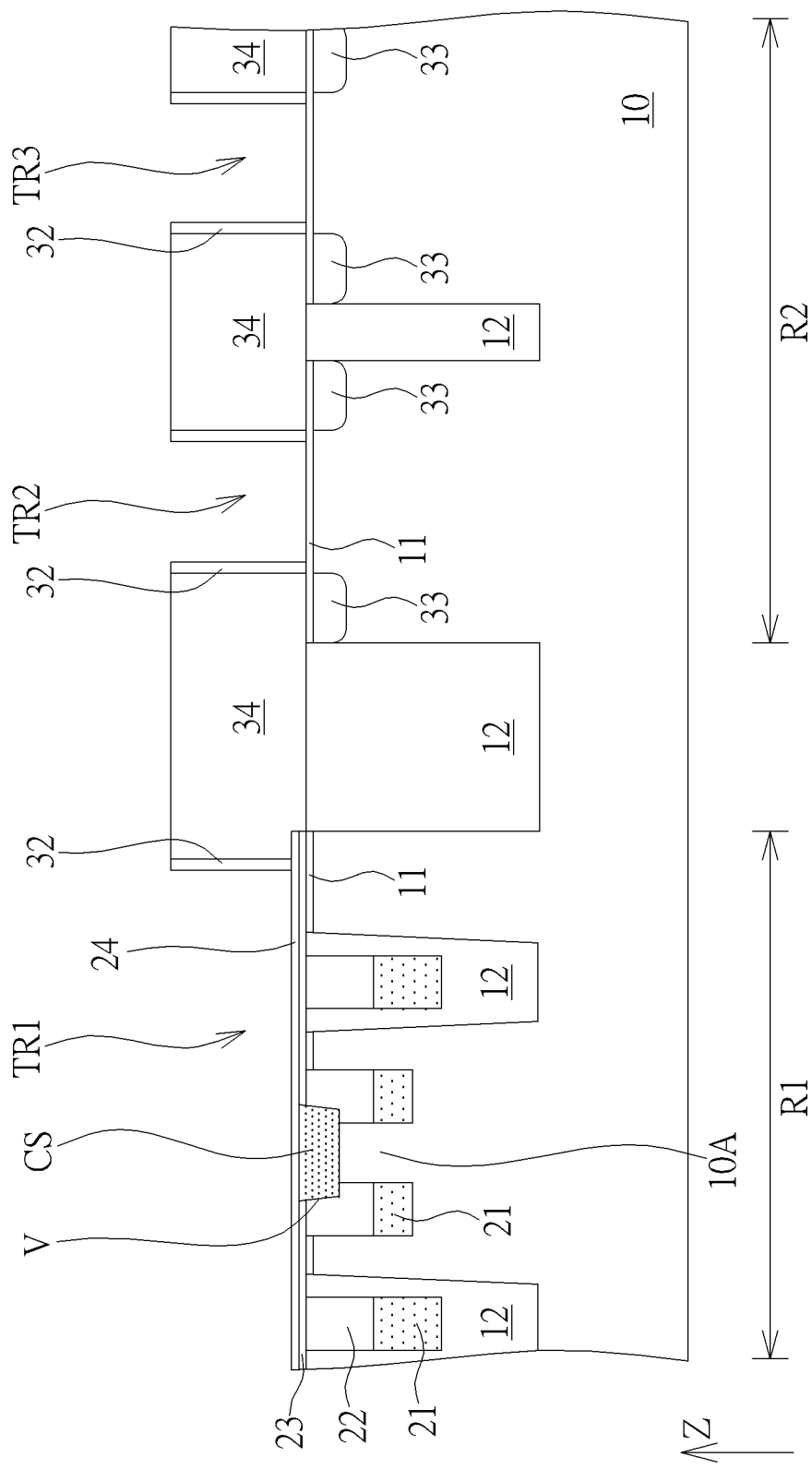

Please refer to FIGS. 1-7. FIGS. 1-7 are schematic drawings illustrating a manufacturing method of a semiconductor memory device according to a first embodiment of the present invention. A manufacturing method of a semiconductor memory device is provided in this embodiment, and the manufacturing method includes the following steps. As shown in FIG. 1 and FIG. 2, a semiconductor substrate 10 is provided. A memory cell region R1 and a peripheral region R2 may be defined on the semiconductor substrate 10. A plurality of memory cells may be formed in the memory cell region R1, and units other than the memory cells may be formed in the peripheral region R2, such as transistors configured to control signals transmitted by word lines and/or bit lines, but not limited thereto. The semiconductor substrate 10 may include silicon substrate, epitaxial silicon substrate, silicon germanium substrate, silicon carbide substrate or silicon-on-insulator (SOI) substrate, but not limited thereto. In some embodiments, a shallow trench isolation 12 may be formed in the semiconductor substrate 10. The shallow trench isolation 12 in the memory cell region R1 may be used to define a plurality of active areas 10A in the semiconductor substrate 10, the shallow trench isolation 12 in the peripheral region R2 may be used to isolate adjacent transistors, and a part of the shallow trench isolation 12 may be located at the interface between the memory cell region R1 and the peripheral region R2, but not limited thereto. In addition, before the step of forming the shallow trench isolation 12, an interfacial layer 11 may be formed on the semiconductor substrate 10, but not limited thereto. Additionally, a plurality of word lines 21 may be formed in the memory cell region R1 of the semiconductor substrate 10, and the word lines 21 in this embodiment may be buried word lines, but not limited thereto. The word lines 21 may be formed in the semiconductor substrate 10 by a buried configuration, and a word line cap layer 22 may be formed above and cover the word lines 21. In some embodiments, other kinds of the word line structures may also be applied according to other considerations. In addition, the word lines 21 may include a conductive material such as aluminum (Al), tungsten (W), copper (Cu), or titanium aluminide (TiAl) and a word line dielectric layer such as silicon oxide, and the word line cap layer 22 may include silicon nitride, silicon oxynitride, silicon carbonitride, or other suitable insulation materials.

As shown in FIG. 1 and FIG. 2, a dielectric layer 34 may be formed on the semiconductor substrate 10, a first trench TR1 may be formed on the memory cell region R1, and a second trench TR2 may be formed on the peripheral region R2. The first trench TR1 and the second trench TR2 may penetrate the dielectric layer 34 respectively. Specifically, the steps of forming the first trench TR1 and the second trench TR2 may include but are not limited to the following steps. Firstly, before the step of forming the dielectric layer 34, a dummy bit line 31A may be formed on the memory cell region R1 of the semiconductor substrate 10 and a plurality of dummy gates 31B may be formed on the peripheral region R2 of the semiconductor substrate 10. The dummy bit line 31A and the dummy gates 31B may be formed concurrently by patterning a material layer 31, and the material layer 31 may include a silicon layer, such as a polysilicon layer, an amorphous silicon layer, or other suitable silicon-containing material layers, but not limited thereto. In some embodiments, before the step of forming the dielectric layer 34, a sidewall spacer 32 may be formed on sidewalls of the dummy bit line 31A and the dummy gates 31B, and the sidewall spacer 32 may be used to form a plurality of source/drain regions 33 in the semiconductor substrate 10. Subsequently, the dielectric layer 34 is formed to cover the dummy bit line 31A, the dummy gates 31B, and the semiconductor substrate 10, and a planarization process, such as a chemical mechanical polishing (CMP) process, may be used to remove the dielectric layer 34 above the dummy bit line 31A and the dummy gates 31B in a vertical direction Z. The vertical direction Z may be regarded as a thickness direction of the semiconductor substrate 10, but not limited thereto. In some embodiments, the dummy bit line 31A and the dummy gates 31B may further include a cap layer (not shown) on the material layer 31, and the planarization process mentioned above may be used to remove the cap layer and expose the material layer 31, but not limited thereto. Subsequently, the dummy bit line 31A and the dummy gates 31B are removed, the first trench TR1 may be formed at the position of the dummy bit line 31A, and the second trench TR2 may be formed at the position of one of the dummy gates 31B. Additionally, in some embodiments, a third trench TR3 may be formed on the peripheral region R2 according to some considerations. The third trench TR3 penetrates the dielectric layer 34, and the method of forming the third trench TR may be the same as the method of forming the second trench TR2, but not limited thereto. In other words, the third trench TR3 may be formed by removing one of the dummy gates 31B, and the source/drain regions 33 may be formed in the semiconductor substrate 10 at the two opposite sides of the second trench TR2 and the two opposite sides of the third trench TR3, but not limited thereto.

Subsequently, as shown in FIGS. 3-7, a metal conductive layer 50 is formed. The first trench TR1 and the second trench TR2 are filled with the metal conductive layer 50 for forming a bit line metal structure 50A in the first trench TR1 and a first metal gate structure 50B in the second trench TR2.

The metal conductive layer 50 may include a low resistivity metal material, such as aluminum (Al), tungsten (W), copper (Cu), titanium aluminide (TiAl), or other suitable low resistivity metal conductive materials. The manufacturing method described above may be regarded as a replacement metal gate (RMG) process, and the bit line metal structure 50 on the memory cell region R1 and the metal gate structure on the peripheral region R2 may be formed concurrently by the replacement metal gate process for lowering the resistance of the bit line, enhancing operation performance of devices on the peripheral region R2, and integrating the manufacturing processes.

In some embodiments, a contact hole V may be formed on the memory cell region R1, and a contact structure CS may be formed in the contact hole V. The contact hole V exposes a part of the semiconductor substrate 10, such as the active area 10A described above. The contact structure CS may be located between the bit line metal structure 50A and the semiconductor substrate 10, and the contact structure CS may be electrically connected with the bit line metal structure 50A. The contact structure CS may include a non-metal conductive material such as a conductive polysilicon material or other suitable conductive materials such as a metal conductive material. As shown in FIGS. 1-7, in some embodiments, the contact hole V and the contact structure CS may be formed before the step of forming the first trench TR1 and the step of forming the second trench TR2, but not limited thereto. An insulation layer 23 may be formed on the memory cell region R1 before the step of forming the contact hole V according to some considerations, and the contact hole V may be formed penetrating the insulation layer 23 for exposing the active area 10A under the insulation layer 23. Additionally, a protection layer 24 may be formed on the contact structure CS before the step of forming the first trench TR1 and the step of forming the second trench TR2 for keeping the contact structure CS from being influenced by the subsequent processes.

Figure 3:
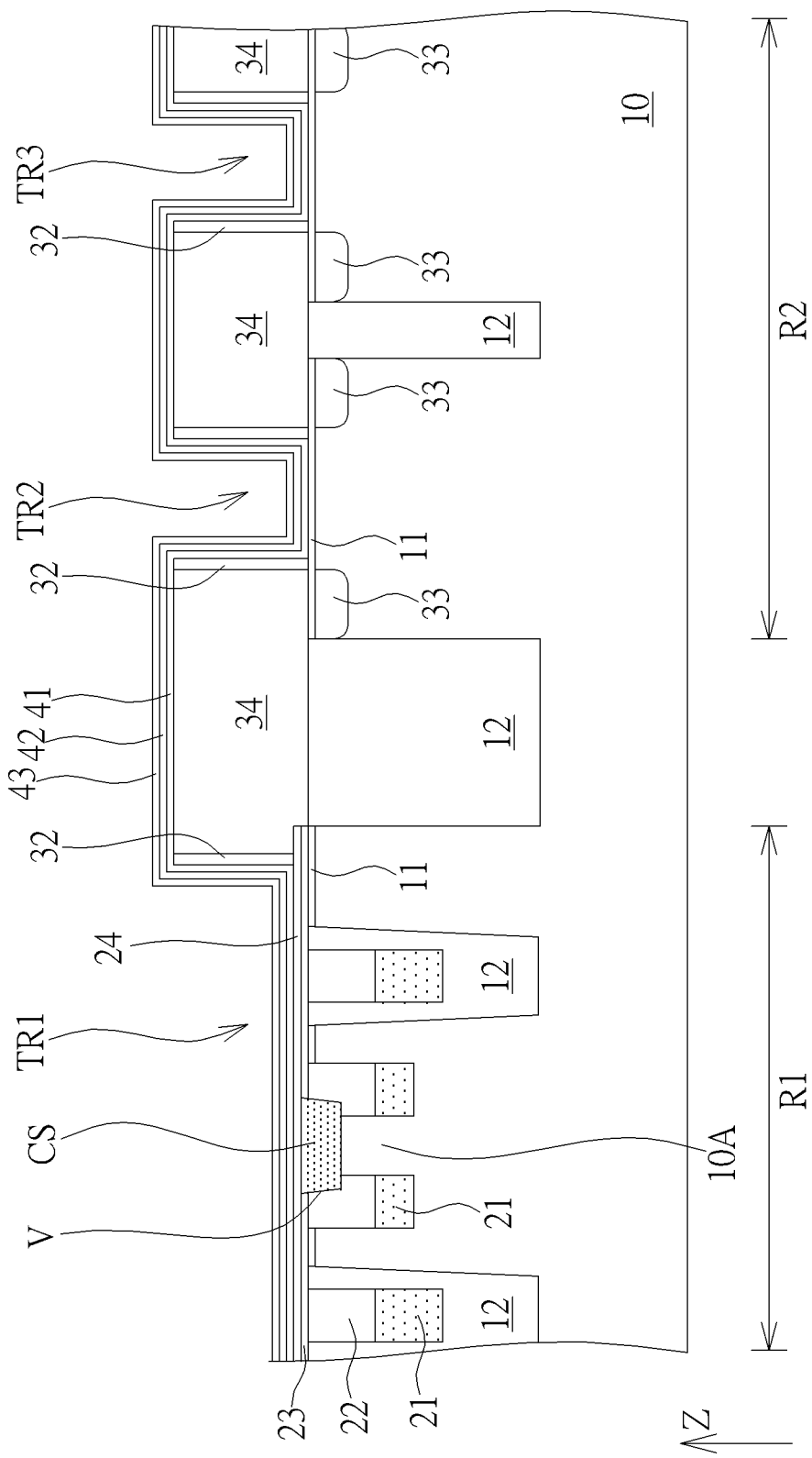

Specifically, other material layers may be formed before the step of forming the metal conductive layer 50. As shown in FIGS. 3-7, a gate dielectric layer 41 may be formed on the semiconductor substrate 10 before the step of forming the metal conductive layer 50. The gate dielectric layer 41 is at least partially formed on the peripheral region R2, and at least a part of the gate dielectric layer 41 is located between the first metal gate structure 50B and the semiconductor substrate 10. As shown in FIG. 3, in some embodiments, the gate dielectric layer 41 may be formed conformally on the first trench TR1, the second trench TR2, the third trench TR3, and the dielectric layer 34. In other words, the gate dielectric layer 41 may be partly formed in the first trench TR1, partly formed in the second trench TR2, and partly formed in the third trench TR3. The gate dielectric layer 41 may include a high dielectric constant (high-k) dielectric material, such as hafnium oxide ($HfO_2$), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k dielectric materials.

Additionally, as shown in FIGS. 3-7, a first barrier layer 42 may be formed on the semiconductor substrate 10 before the step of forming the metal conductive layer 50. The first barrier layer 42 may be formed conformally on the gate dielectric layer 41, and the first barrier layer 42 may be partly formed in the first trench TR1, partly formed in the second trench TR2, and partly formed in the third trench TR3 also. The first barrier layer 42 may include metal nitride, such as tantalum nitride (TaN), or other suitable metal compound barrier materials. In addition, a first work function layer 43 may be formed on the first barrier layer 42 before the step of forming the metal conductive layer 50. The first work function layer 43 may be formed conformally on the first barrier layer 42, and the first work function layer 43 may be partly formed in the first trench TR1, partly formed in the second trench TR2, and partly formed in the third trench TR3 also. The first work function layer 43 may include a P-type work function layer, such as titanium nitride (TiN), titanium carbide (TiC), or other suitable work function materials, and the first work function layer 43 may include a single layer structure or a multiple layer structure.

Figure 4:
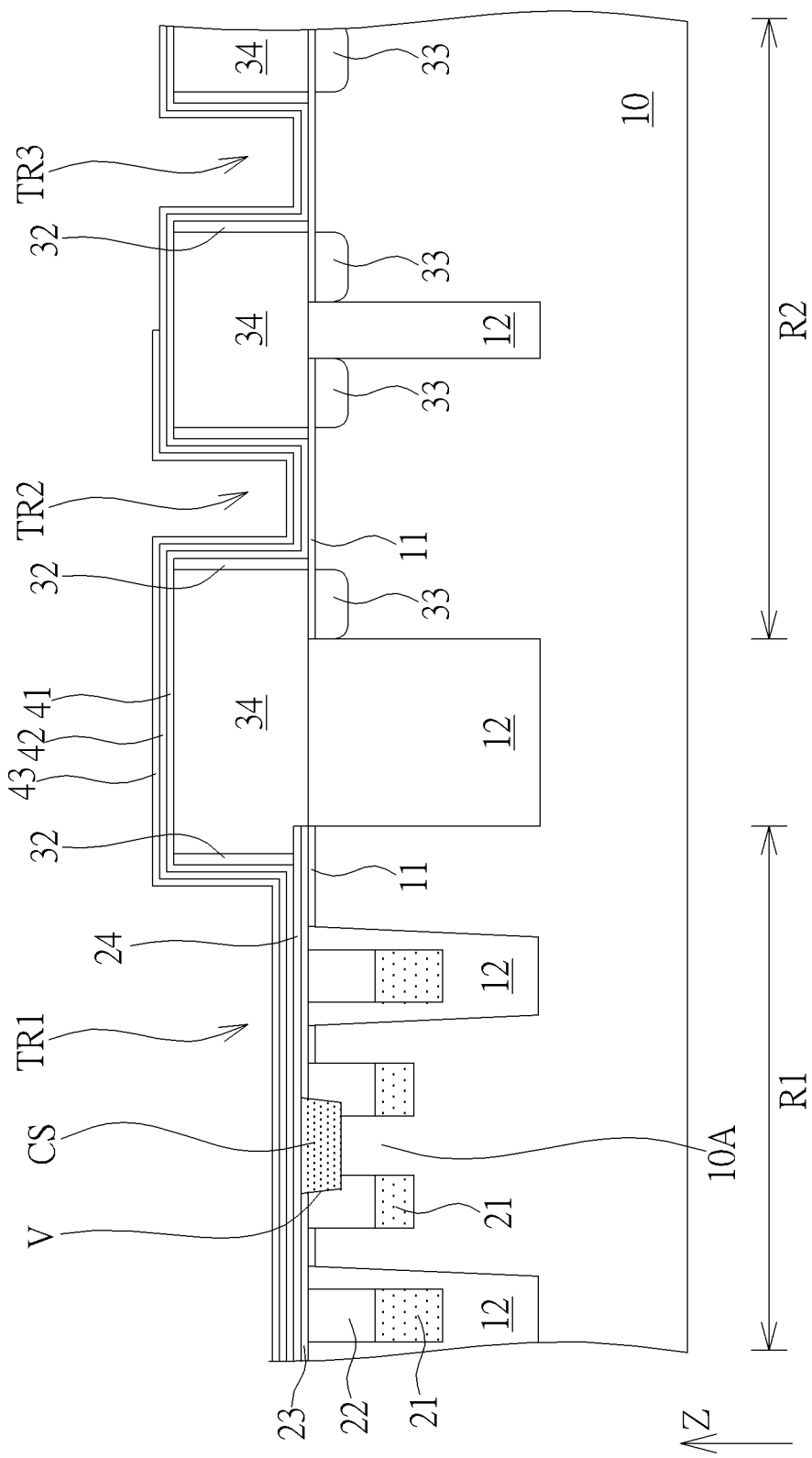
Figure 5:
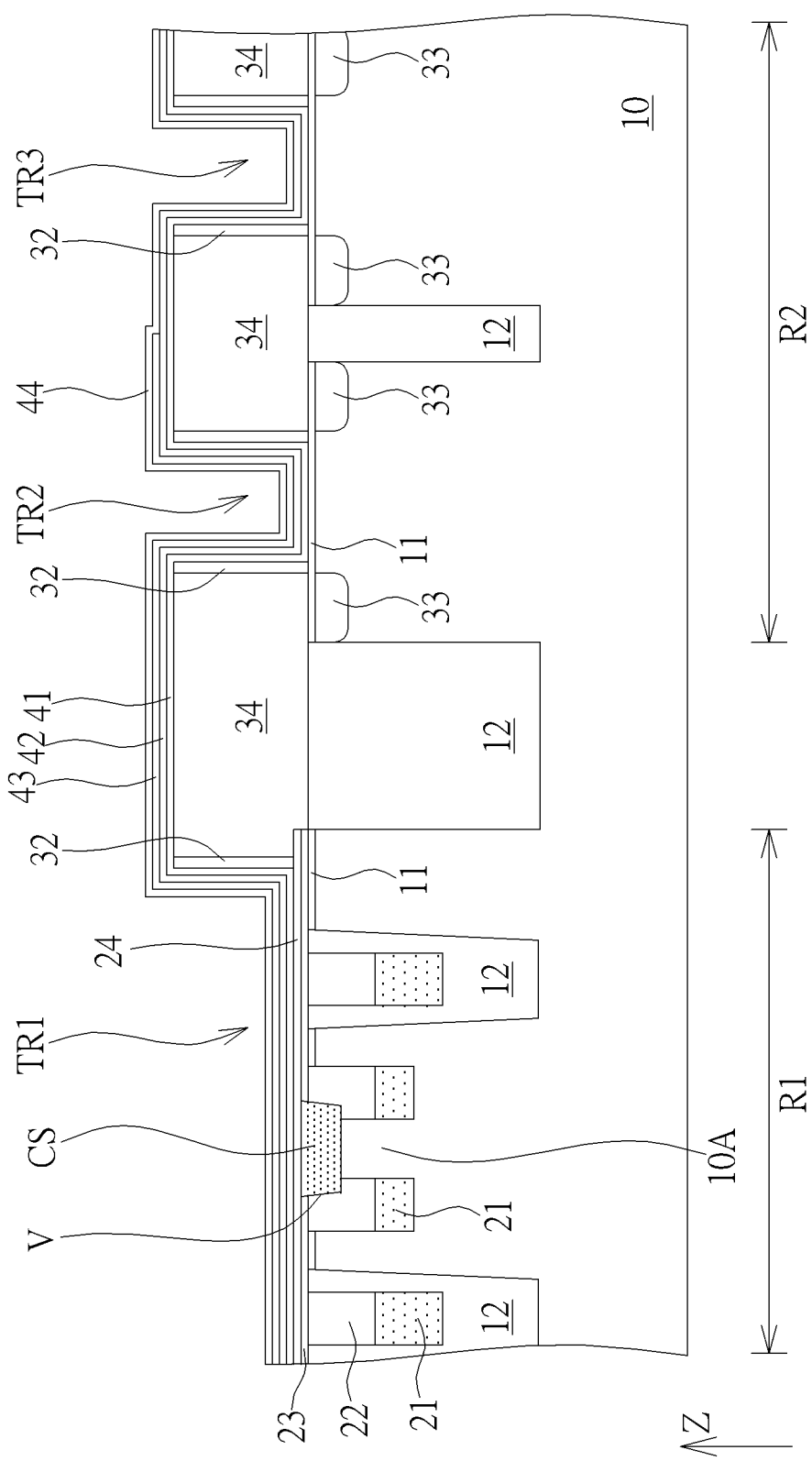
Figure 7:
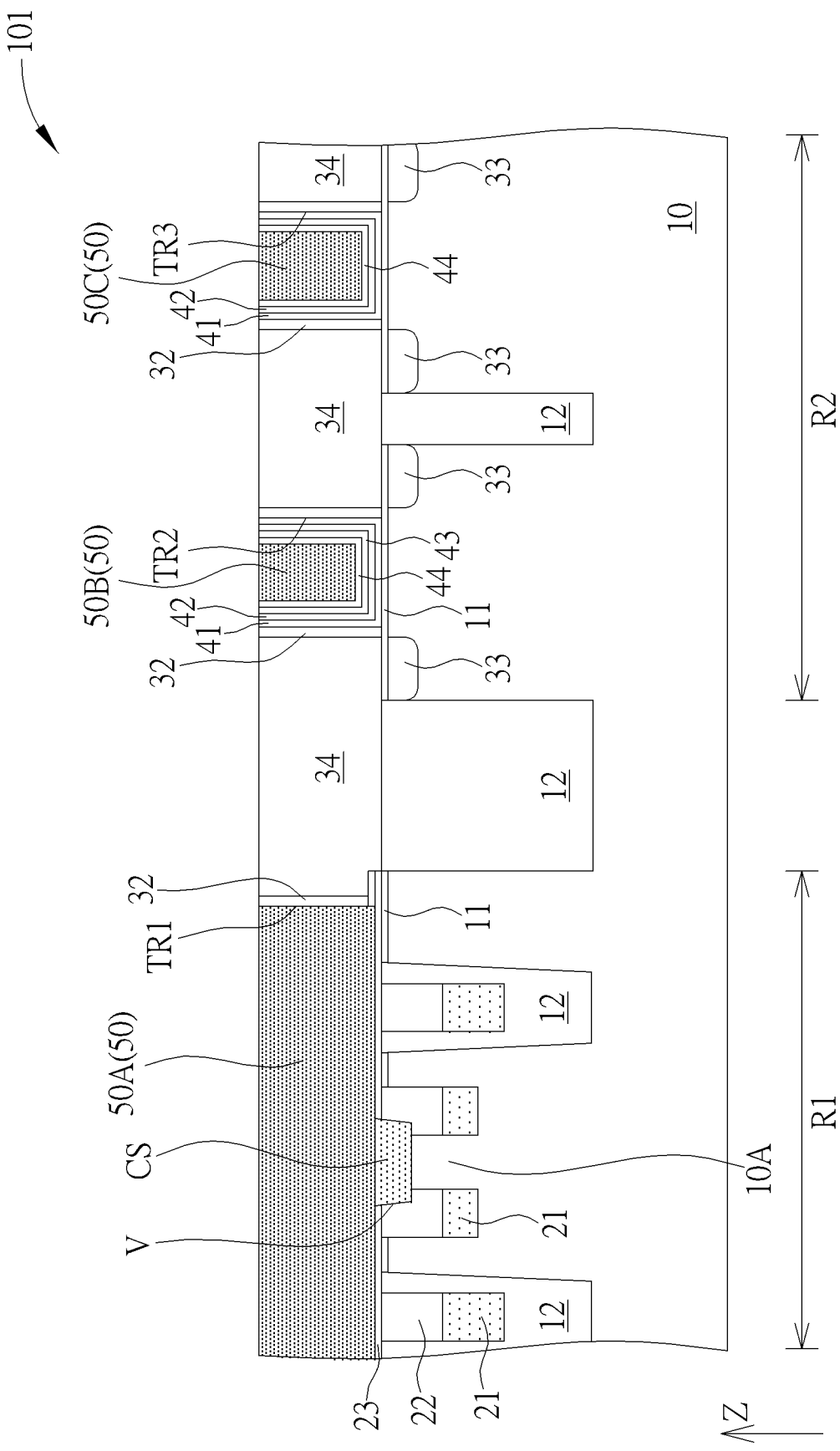

In some embodiments, the materials formed in the second trench TR2 and the third trench TR3 may be used to form gate structures in transistors with different conductivity types and/or different threshold voltages, but not limited thereto. Therefore, as shown in FIG. 3, FIG. 4, and FIG. 7, the first work function layer 43 in the third trench TR3 may be removed before the step of forming the metal conductive layer 50 according to some considerations. Subsequently, as shown in FIG. 5 and FIG. 7, a second work function layer 44 may be formed on the semiconductor substrate 10 before the step of forming the metal conductive layer 50 and after the step of removing the first work function layer 43 in the third trench TR3. The second work function layer 44 may be formed conformally on the first work function layer 43 and the first barrier layer 42 which is not covered by the first work function layer 43. Therefore, the second work function layer 44 may be partly formed in the first trench TR1, partly formed in the second trench TR2, and partly formed in the third trench TR3 also. In some embodiments, the first work function layer 43 and the second work function layer 44 may be work function layers with different conductivity types. For example, the first work function layer 43 may be a P-type work function layer, the second work function layer 44 may be an N-type work function layer, and the second work function layer 44 may include titanium aluminide (TiAl), titanium aluminum carbide (TiAlC), or other suitable N-type work function materials, but not limited thereto.

Figure 6:
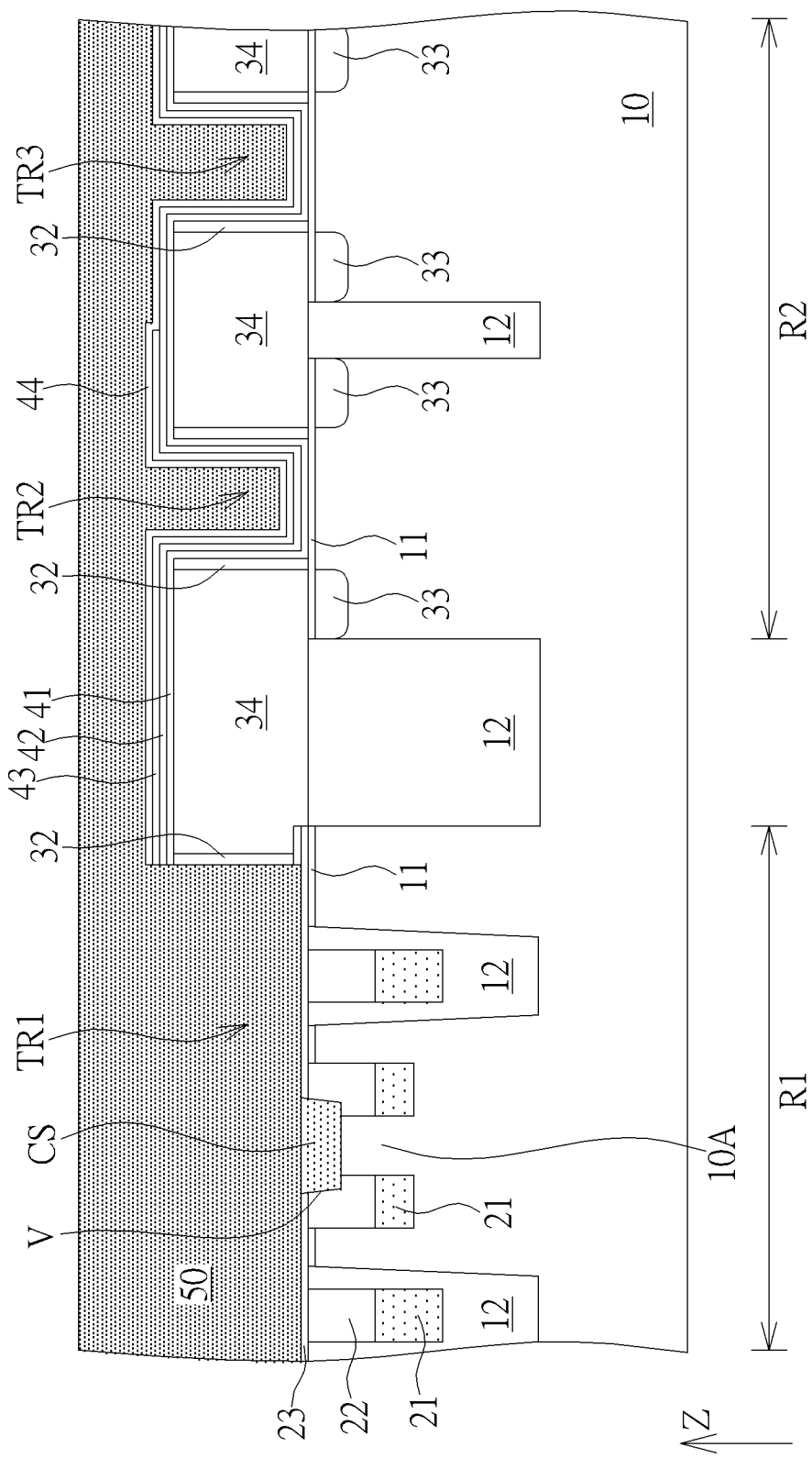

As shown in FIG. 5 and FIG. 6, the gate dielectric layer 41, the first barrier layer 42, the first work function layer 43, and the second work function layer 44 in the first trench TR1 may be removed before the step of forming the metal conductive layer 50. The protection layer 24 on the contact structure CS may be removed before the step of forming the metal conductive layer 50, and the metal conductive layer 50 formed in the first trench TR may contact and be electrically connected with the contact structure CS. As shown in FIG. 6 and FIG. 7, the third trench TR3 may be filled with the metal conductive layer 50 for forming a second metal gate structure 50C in the third trench TR3. In some embodiments, a chemical mechanical polishing process may be used to remove material layers outside the first trench TR1, the second trench TR2, and the third trench TR3 for forming the bit line metal structure 50A, the first metal gate structure 50B, and the second metal gate structure 50C respectively and forming a semiconductor memory device 101 shown in FIG. 7. In the semiconductor memory device 101, the bit line metal structure 50A may be used as a bit line in memory cells and have low resistance. Additionally, the first metal gate structure 50B in the second trench TR2, the second metal gate structure 50C in the third trench TR3, and the different work function layer stacks in the second trench TR2 and the third trench TR3 may be used to form gate structures in transistors with different conductivity types and/or different threshold voltages. In other words, the bit line metal structure 50A on the memory cell region R1 and the metal gate structures in the peripheral region R2 may be formed concurrently by the replacement metal gate process, and the purposes of process integration and process simplification may be achieved accordingly.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 8:
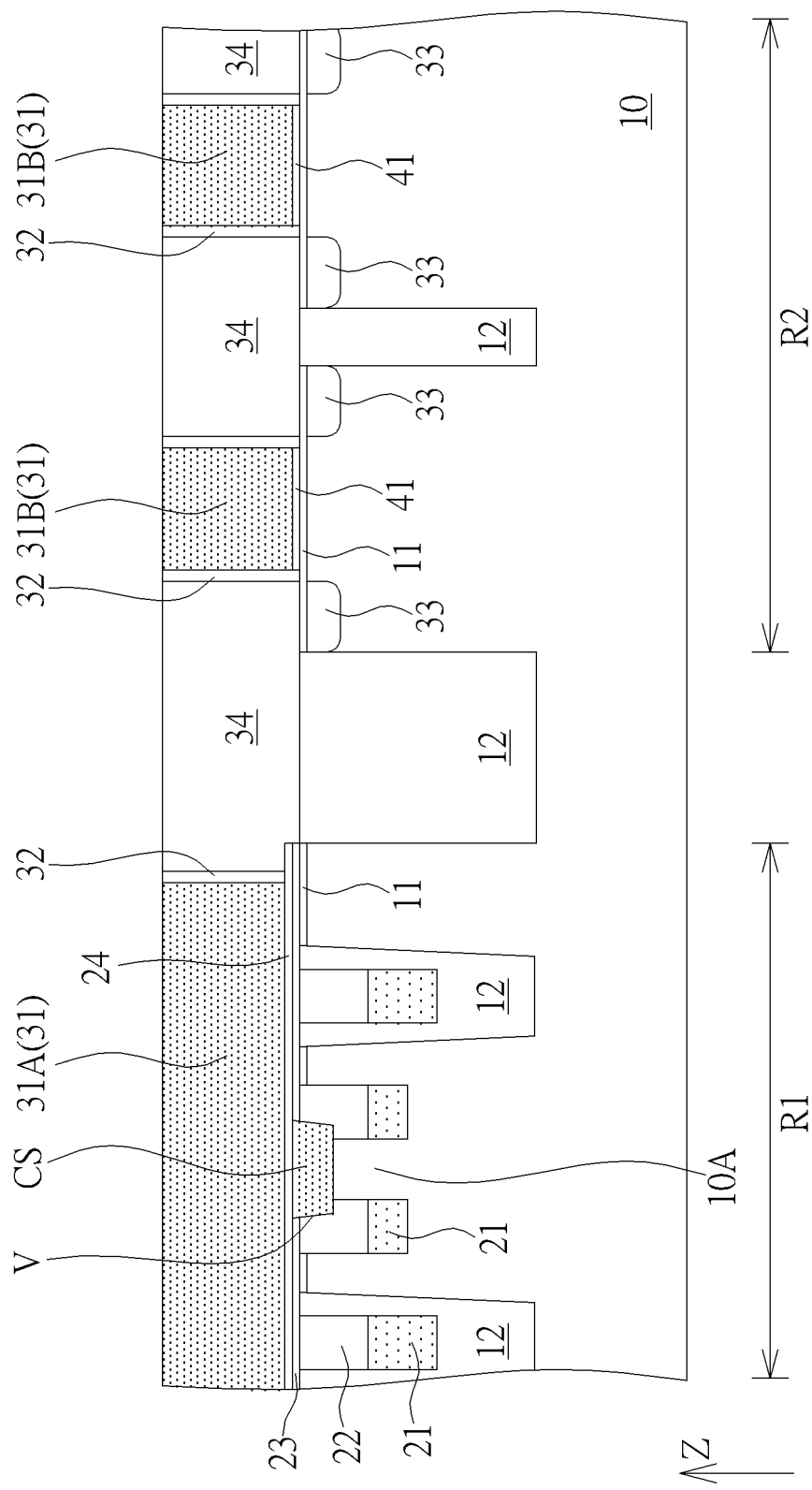
Figure 9:
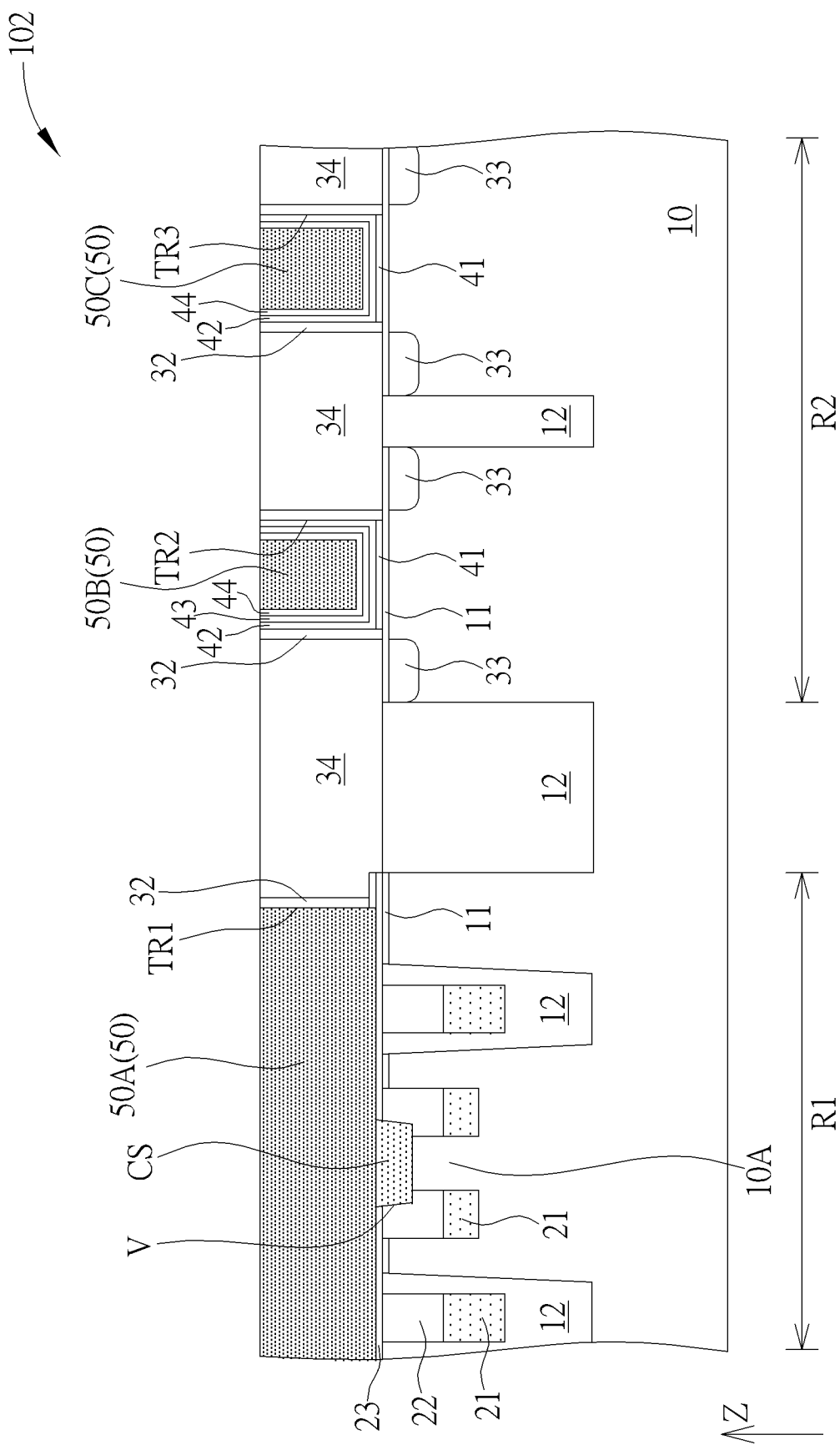
Figure 10:
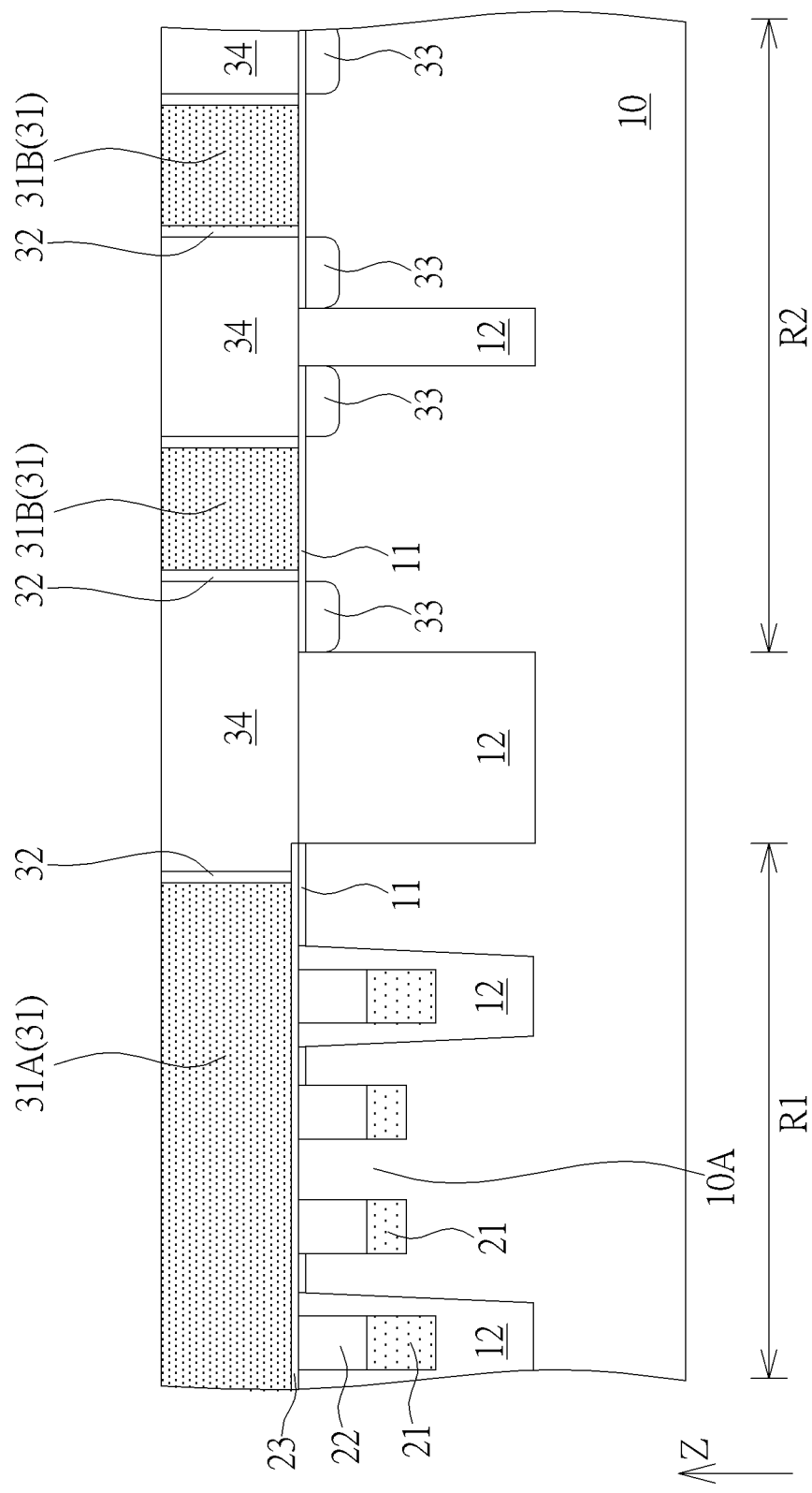

Please refer to FIG. 8 and FIG. 9. FIG. 8 and FIG. 9 are schematic drawings illustrating a manufacturing method of a semiconductor memory device 102 according to a second embodiment of the present invention. As shown in FIG. 8 and FIG. 9, the difference between the manufacturing method in this embodiment and the manufacturing method in the first embodiment described above is that the gate dielectric layer 41 in this embodiment may be formed before the step of forming the first trench TR1 and the step of forming the second trench TR2, and the gate dielectric layer 41 may be located between the dummy gate 31B and the semiconductor substrate accordingly. Therefore, the manufacturing method in this embodiment may be regarded as a high-k first process, and the manufacturing process of the first embodiment described above may be regarded as a high-k last process, but not limited thereto.

Figure 11:
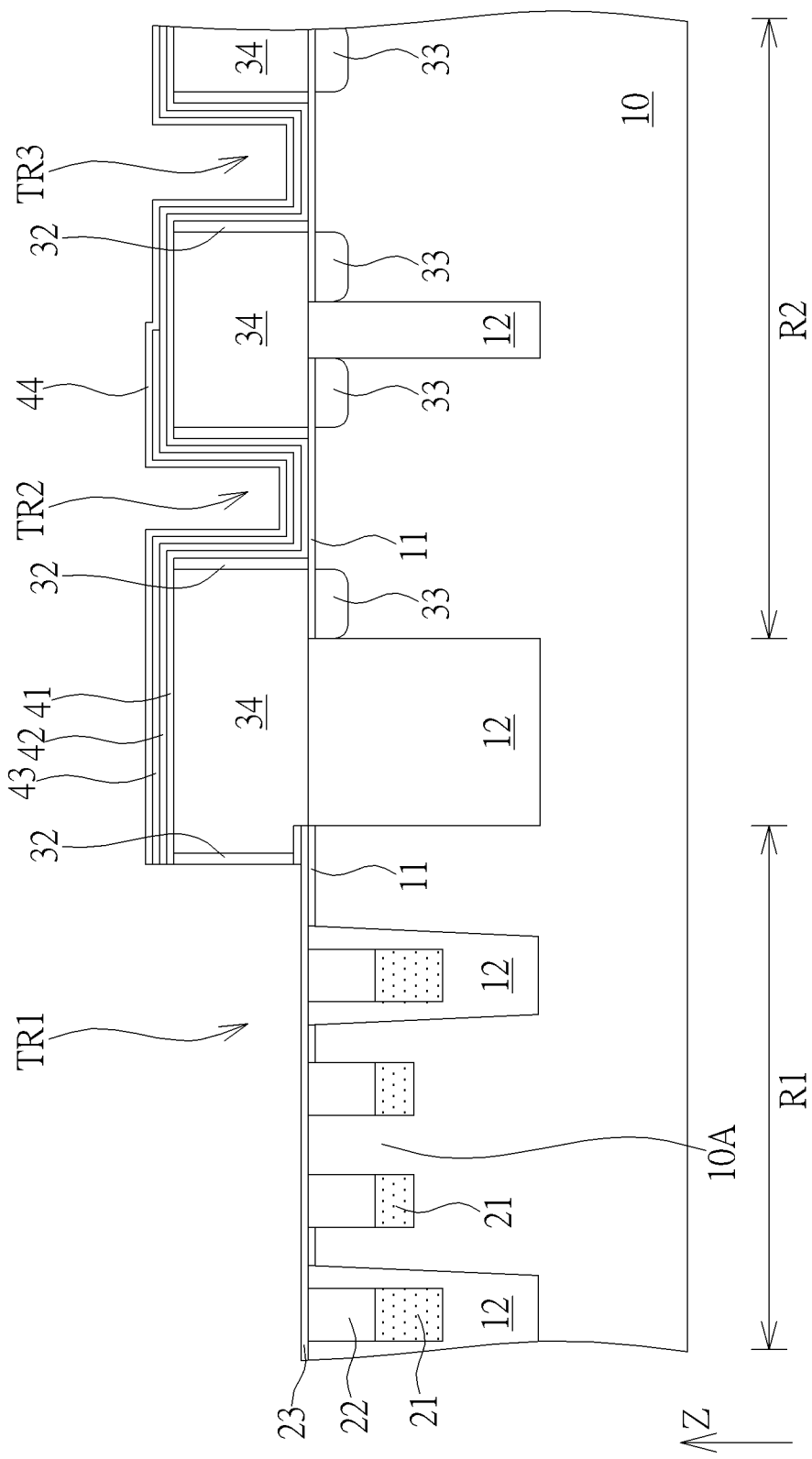
Figure 12:
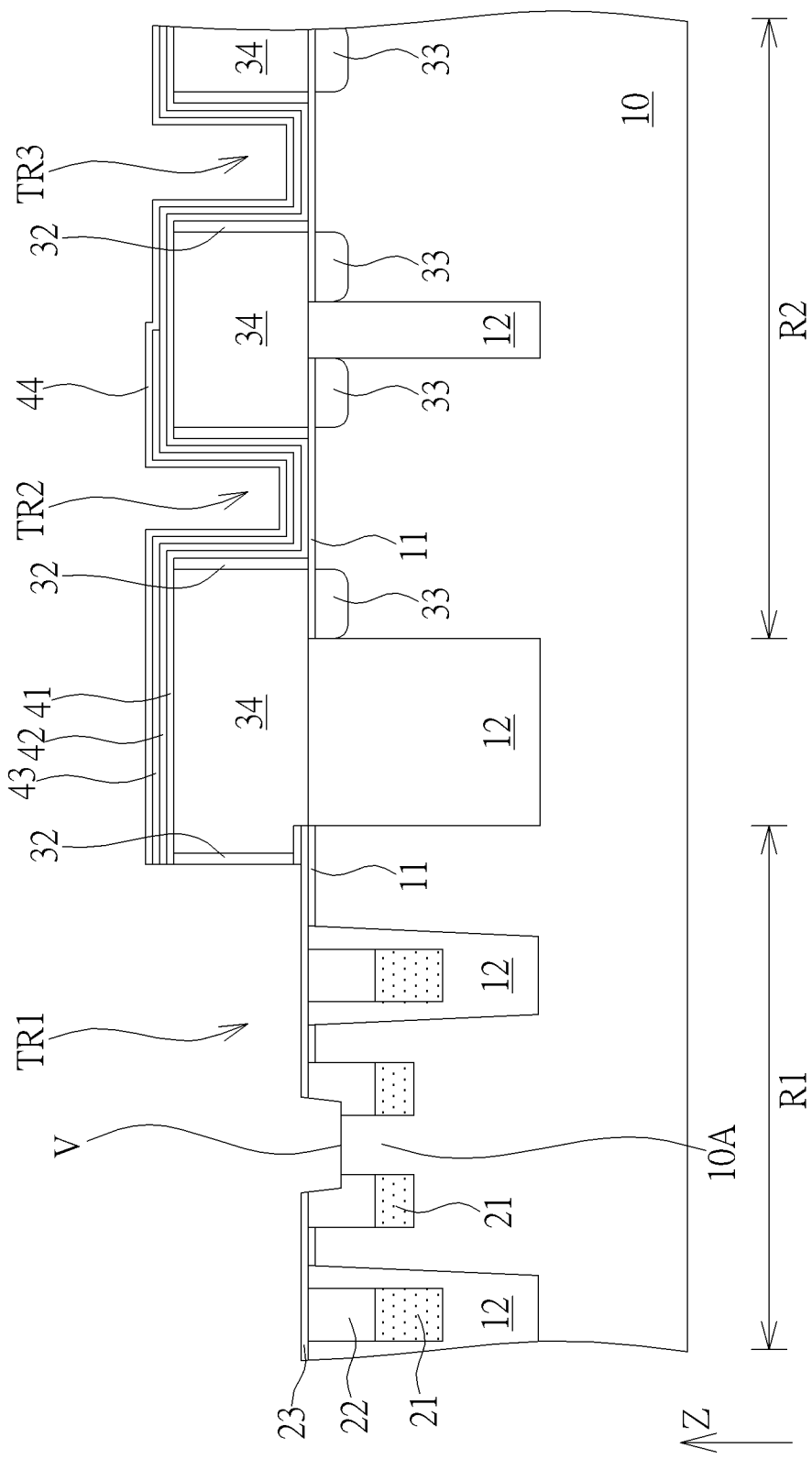
Figure 13:
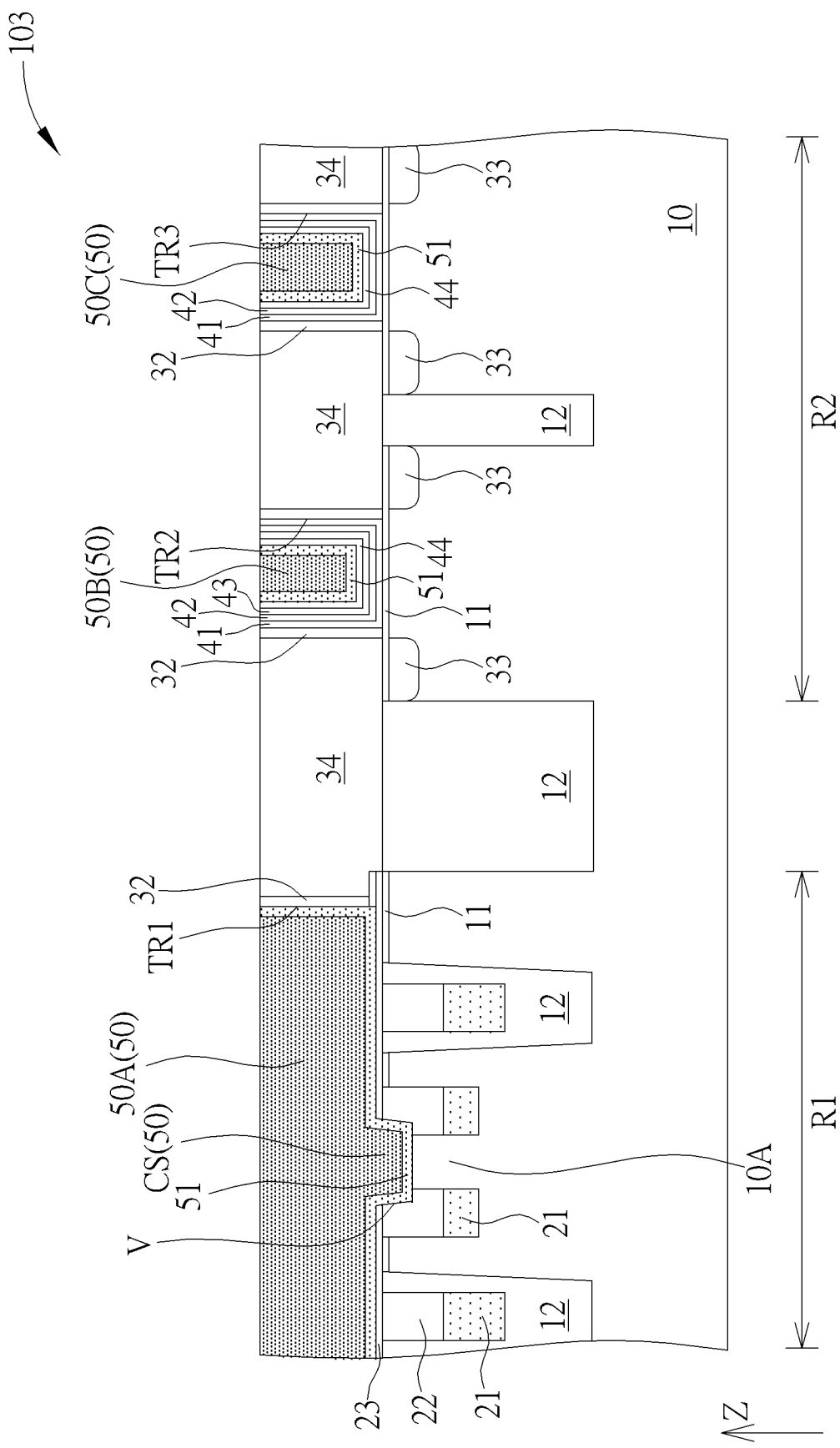

Please refer to FIGS. 10-13. FIGS. 10-13 are schematic drawings illustrating a manufacturing method of a semiconductor memory device 103 according to a third embodiment of the present invention. The difference between the manufacturing method in this embodiment and the manufacturing method in the first embodiment described above is that, as shown in FIG. 10, the contact hole and the contact structure are not formed when the dummy bit line 31A and the dummy gates 31B are formed in this embodiment. As shown in FIG. 11, the contact hole and the contact structure are still not formed when the first trench TR1, the second trench TR2, and the third trench TR3 are formed in this embodiment. As shown in FIG. 11 and FIG. 12, the contact hole V in this embodiment is formed after the step of forming the first trench TR1 and the step of forming the second trench TR2. The contact hole V may excavate downwards from the bottom surface of the first trench TR1, and the contact hole V may be directly connected with the first trench TR1 accordingly. As shown in FIG. 12 and FIG. 13, in some embodiments, the metal conductive layer 50 may be further formed in the contact hole V, and the contact hole V may be filled with the metal conductive layer 50 for forming the contact structure CS. In other words, the material of the contact structure CS may be identical to the material of the bit line metal structure 50A in some embodiments, and the contact structure CS may be directly connected with the bit line metal structure 50A, but not limited thereto. In some embodiments, the contact structure CS and the bit line metal structure 50A may also be formed by different materials when the contact hole V is formed after the step of forming the first trench TR1. Additionally, in some embodiments, a second barrier layer 51 may be formed on the semiconductor substrate 10 before the step of forming the metal conductive layer 50, and the second barrier layer 51 may be partly formed in the first trench TR1 and partly formed in the contact hole V. Therefore, the metal conductive layer 50 formed in the first trench TR1 and the contact hole V may be formed on the second barrier layer 51, and the second barrier layer 51 may be used to avoid negative influence when the metal conductive layer 50 directly contacts the semiconductor substrate 10, such as the device deterioration issue caused by the contents of the metal conductive layer 50 diffusing to the active areas 10A. The second barrier layer 51 may include a metal nitride layer, such as tantalum nitride or other suitable metal compound barrier materials. Additionally, in some embodiments, the second barrier layer 51 may be further partly formed in the second trench TR2 and partly formed in the third trench TR3, but not limited thereto.

To summarize the above descriptions, according to the manufacturing method of the semiconductor device in the present invention, the bit line metal structure on the memory cell region and the metal gate structures on the peripheral region may be formed concurrently by the replacement metal gate process. The bit line metal structure may be used to reduce the electrical resistance of the bit line. The metal gate structures on the peripheral region may be used to enhance the operation performance of the devices on the peripheral region. The purposes of process integration and process simplification may be achieved by forming the bit line metal structure and the metal gate structures concurrently by the replacement metal gate process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A manufacturing method of a semiconductor memory device, comprising:
   providing a semiconductor substrate, wherein a memory cell region and a peripheral region are defined on the semiconductor substrate;
   forming a contact hole on the memory cell region, wherein the contact hole exposes a part of the semiconductor substrate;
   forming a dielectric layer on the semiconductor substrate;
   forming a first trench on the memory cell region, wherein the first trench penetrates the dielectric layer;
   forming a second trench on the peripheral region, wherein the second trench penetrates the dielectric layer;
   forming a metal conductive layer, wherein the first trench and the second trench are filled with the metal conductive layer for forming a bit line metal structure in the first trench and a first metal gate structure in the second trench; and
   forming a contact structure in the contact hole, wherein the contact structure is located between the bit line metal structure and the semiconductor substrate.

2. The manufacturing method of the semiconductor memory device according to claim 1, wherein the steps of forming the first trench and the second trench comprise:
   forming a dummy bit line on the memory cell region of the semiconductor substrate and forming a dummy gate on the peripheral region of the semiconductor substrate before the step of forming the dielectric layer; and
   removing the dummy bit line for forming the first trench and removing the dummy gate for forming the second trench after the step of forming the dielectric layer.

3. The manufacturing method of the semiconductor memory device according to claim 1, further comprising:
   forming a first barrier layer on the semiconductor substrate before the step of forming the metal conductive layer, wherein the first barrier layer is partly formed in the first trench and partly formed in the second trench; and
   removing the first barrier layer in the first trench before the step of forming the metal conductive layer.

4. The manufacturing method of the semiconductor memory device according to claim 3, further comprising:
   forming a first work function layer on the first barrier layer before the step of forming the metal conductive layer, wherein the first work function layer is partly formed in the first trench and partly formed in the second trench; and
   removing the first work function layer in the first trench before the step of forming the metal conductive layer.

5. The manufacturing method of the semiconductor memory device according to claim 4, further comprising:
   forming a third trench on the peripheral region, wherein the third trench penetrates the dielectric layer, and the third trench is filled with the metal conductive layer for forming a second metal gate structure in the third trench.

6. The manufacturing method of the semiconductor memory device according to claim 5, wherein the first barrier layer and the first work function layer are further formed in the third trench, and the manufacturing method of the semiconductor memory device further comprises:
   removing the first work function layer in the third trench before the step of forming the metal conductive layer.

7. The manufacturing method of the semiconductor memory device according to claim 6, further comprising:
   forming a second work function layer on the semiconductor substrate before the step of forming the metal conductive layer and after the step of removing the first work function layer in the third trench, wherein the second work function layer is partly formed in the first trench, partly formed in the second trench, and partly formed in the third trench; and
   removing the second work function layer in the first trench before the step of forming the metal conductive layer.

8. The manufacturing method of the semiconductor memory device according to claim 1, further comprising:
   forming a gate dielectric layer on the semiconductor substrate, wherein the gate dielectric layer is at least partially formed on the peripheral region, and at least a part of the gate dielectric layer is located between the first metal gate structure and the semiconductor substrate.

9. The manufacturing method of the semiconductor memory device according to claim 8, wherein the gate dielectric layer is formed before the step of forming the first trench and the step of forming the second trench.

10. The manufacturing method of the semiconductor memory device according to claim 8, wherein the gate dielectric layer is partly formed in the first trench and partly formed in the second trench, and the manufacturing method of the semiconductor memory device further comprises:
    removing the gate dielectric layer in the first trench before the step of forming the metal conductive layer.

11. The manufacturing method of the semiconductor memory device according to claim 1, wherein the contact structure is formed before the step of forming the first trench and the step of forming the second trench.

12. The manufacturing method of the semiconductor memory device according to claim 11, further comprising:
    forming a protection layer on the contact structure before the step of forming the first trench and the step of forming the second trench; and
    removing the protection layer on the contact structure before the step of forming the metal conductive layer.

13. The manufacturing method of the semiconductor memory device according to claim 11, wherein the contact structure includes a non-metal conductive material.

14. The manufacturing method of the semiconductor memory device according to claim 13, wherein the contact structure is electrically connected with the bit line metal structure.

15. The manufacturing method of the semiconductor memory device according to claim 1, wherein the contact hole is formed after the step of forming the first trench and the step of forming the second trench.

16. The manufacturing method of the semiconductor memory device according to claim 15, wherein the contact hole is filled with the metal conductive layer for forming the contact structure.

17. The manufacturing method of the semiconductor memory device according to claim 16, wherein a material of the contact structure is identical to a material of the bit line metal structure, and the contact structure is directly connected with the bit line metal structure.

18. The manufacturing method of the semiconductor memory device according to claim 15, further comprising:
   forming a second barrier layer on the semiconductor substrate before the step of forming the metal conductive layer, wherein the second barrier layer is partly formed in the first trench and partly formed in the contact hole.

19. The manufacturing method of the semiconductor memory device according to claim 18, wherein the second barrier layer is further formed in the second trench.

* * * * *